United States Patent [19]
Meister et al.

[11] Patent Number: 5,432,120
[45] Date of Patent: Jul. 11, 1995

[54] METHOD FOR PRODUCING A LATERALLY LIMITED SINGLE-CRYSTAL REGION WITH SELECTIVE EPITAXY AND THE EMPLOYMENT THEREOF FOR MANUFACTURING A BIPOLAR TRANSISTOR AS WELL AS A MOS TRANSISTOR

[75] Inventors: Thomas Meister, Taufkirchen; Reinhard Stengl, Stadtbergen, both of Germany

[73] Assignee: Siemens Aktiengesellschaft, Munich, Germany

[21] Appl. No.: 154,551

[22] Filed: Nov. 19, 1993

[30] Foreign Application Priority Data

Dec. 4, 1992 [DE] Germany .................. 42 40 924.1

[51] Int. Cl.⁶ .................................. H01L 21/20
[52] U.S. Cl. ........................... 437/89; 117/95; 117/923
[58] Field of Search ............... 437/89; 117/923, 95

[56] References Cited

U.S. PATENT DOCUMENTS

| 3,639,186 | 2/1972 | Forster et al. | 437/89 |
| 4,871,685 | 10/1989 | Taka et al. | |
| 4,885,617 | 12/1989 | Mazure-Espejo et al. | |
| 5,090,932 | 2/1992 | Dieumegard et al. | 437/89 |

FOREIGN PATENT DOCUMENTS 057587 8/1989 European Pat. Off. .

OTHER PUBLICATIONS

"Silicon Wafer Preparation for Low-Temperature Selective Epitaxial Growth," Galewski et al., IEEE Trans. on Semicon. Man., vol. 3, No. 3, Aug. 1990 (pp. 93–97).
"Growth Condition Dependence of SEG Planarity and Electrical Characteristics," Stivers et al., Proc. of 19th Int. Cong. on CVD, Oct. 1987, pp. 389–397.
"Selective Silicon Deposition for the Megabit Age," Borland et al., Solid State Techn., Jan. 1990, pp. 73–78.
"Chemical Vapor Deposition of Selective Epitaxial Silicon Layers," Pai et al., J. Electrochem. Soc., vol. 137, No. 3, mar. 1990, pp. 971–976.
"A Submicron Dual Buried Layer Twin Well CMOS SEG Process," Manoliu et al., IDEM Digest, 1987, pp. 20–23.

Primary Examiner—R. Bruce Breneman
Assistant Examiner—Linda J. Fleck
Attorney, Agent, or Firm—Hill, Steadman & Simpson

[57] ABSTRACT

For producing a laterally limited, single-crystal region on a substrate, for example the collector of a bipolar transistor or the active region of a MOS transistor, a mask layer having an opening is produced on the surface of a substrate. The surface of the substrate is exposed within the opening. The cross-section of the opening parallel to the surface of the substrate at the surface of the substrate projects laterally beyond that cross-section at the surface of the mask layer. The sidewall of the opening proceeds essentially perpendicularly relative to the surface of the substrate in the region of the surface of the mask layer and has a step-shaped profile in cross-section perpendicularly relative to the surface of the substrate. The single-crystal region is formed by selective epitaxy within the opening.

16 Claims, 5 Drawing Sheets

METHOD FOR PRODUCING A LATERALLY LIMITED SINGLE-CRYSTAL REGION WITH SELECTIVE EPITAXY AND THE EMPLOYMENT THEREOF FOR MANUFACTURING A BIPOLAR TRANSISTOR AS WELL AS A MOS TRANSISTOR

BACKGROUND OF THE INVENTION

1. Field of the Invention

The present invention is directed to a method for producing a laterally limited single-crystal region in a substrate using selective epitaxy. Such a region may be the collector of a bipolar transistor or the action region of a MOS transistor, and thus the invention is also directed to methods for manufacturing bipolar and/or MOS transistors.

2. Description of the Prior Art

Selective epitaxy is increasingly employed in semiconductor technology in the production of electrically active regions is substrate. Before the selective epitaxy, a mask structure having an opening wherein the surface of the substrate is exposed is produced on the surface of a substrate. The exposed surface of the substrate is composed of a single-crystal semiconductor, particularly silicon. The mask structure is selected such that single-crystal semiconductor material grows in the selective epitaxy proceeding from the exposed surface of the substrate and such that no semiconductor material grows on the surface of the mask structure. A single-crystal region that is completely surrounded by the mask structure arises in this way. The mask structure is essentially composed of insulating material and serves the purpose of insulating the active region. In selective epitaxy, the electrically active regions are grown in openings of an insulating layer.

In conventional insulation methods such as, for example, LOCOS or a trench, by contrast, the regions required for insulation are "dielectrically filled," for example with oxide.

It is known from J. Borland et al., Solid State Techn., January 1990, pages 73-78 to produce a collector, base and/or emitter in bipolar technology on the basis of selective epitaxy. Selective epitaxy is also employed in CMOS technology. Thus, for example, a CMOS well (see, for example, J. Manoliu et al., IEDM Digest, 1987, pages 20-23) or source and drain (see, for example, European Application 0 268 941 corresponding to U.S. Pat. No. 4,885,617) can be filled by selective epitaxy.

Tests have shown, however, that diodes produced with selective epitaxy are inferior to conventionally manufactured diodes, for example, with LOCOS insulation, with respect to leakage currents (see A. Stivers et al., Proc. of 19th Int. Conf. on CVD, October 1987, Honolulu pages 389-397). These leakage currents are associated with sidewall defects. Sidewall defects are crystal faults that arise along the edges of the active epitaxial layer. Since the semiconductor material, for example silicon, grows epitaxially in the opening of the mask structure which, for example, is composed of $SiO_2$ or $Si_3N_4$ in selective epitaxy, and the sidewalls of the opening composed of dielectric material represent a source of crystal faults, crystal faults comprising the aforementioned sidewall defects arise in this region during the selective deposition.

In order to avoid the sidewall defects in selective epitaxy, it is known to line the dielectric sidewalls with polysilicon or nitride (see, for example, A. Stivers et al., Proc. of 10th Int. Conf. on CVD, October 1987, Honolulu, pages 389-397). Further, C. S. Pai et al., J. Electrochem. Soc., Vol. 137, 1990, pages 971-976 discloses that the appearance of sidewall defects is minimized under specific epitaxy conditions. It is also known from C. S. Pai et al., J. Electrochem. Soc., Vol. 137 1990, pages 971-976 to reduce the defects by aligning the edges of the active transistor regions along (100) crystal directions in a silicon substrate. Substrates wherein the edges of the active transistor regions proceed along (110) directions are, however, usually employed. A rotation of the transistor structures by 45° makes it possible to employ the standard (110) silicon substrates and to nonetheless achieve a reduction in the level of defects.

SUMMARY OF THE INVENTION

An object of the present invention is to provide a method for producing a laterally limited, single-crystal region with selective epitaxy by means of which sidewall defects in the single-crystal region are effectively suppressed, and which allows the manufacture of single-crystal regions that have adequate freedom from defects given employment as an active region.

The above object is achieved in accordance with the principles of the present invention in a method wherein a laterally limited, single-crystal region is produced with selective epitaxy by employing a mask layer on a substrate, the mask layer having an opening which exposes the surface of the substrate, the opening having a sidewall with a step-shaped profile, as seen in a direction perpendicular to the surface of the substrate. The single-crystal region is formed by selective epitaxy within the opening.

The invention utilizes the perception that sidewall defects in selective epitaxy, wherein a mask structure having an opening is arranged at the surface of a substrate of, for example, single-crystal silicon, essentially arise along the boundary surface between silicon and dielectric that is located at the lower edges of the opening. No occurrence of sidewall defects, by contrast, is observed at the boundary surface between dielectric and epitaxially grown region that is located in the middle and upper part of the sidewall of the opening. Proceeding from the lower edge, the defects grow into the active region at an angle of approximately 55°.

The opening in the mask layer in the inventive method is fashioned such that the cross-section of the opening parallel to the surface of the substrate is larger at the surface of the substrate than at the surface of the mask structure. The cross-section at the surface of the substrate thereby projects laterally beyond the cross-section at the surface of the mask layer. The sidewall of the opening in the region of the surface of the mask layer proceeds essentially perpendicularly relative to the surface of the substrate. In the cross-section perpendicular to the surface of the substrate, the sidewall of the opening has a step-shaped profile. As a result, the sidewall has an overhang under which the remainder of the sidewall proceeds set back from the portion of the sidewall thereabove.

In the selective epitaxy, the single-crystal semiconductor material, for example silicon, grows proceeding from the surface of the substrate. Sidewall defects emanating from the boundary surface between silicon and dielectric are interrupted by the overhang. A single-crystal region that is practically free of defects within the cross-section of the opening at the surface of the mask layer thus arises.

The step-shaped profile of the sidewall, in particular, is produced in an etching process that intensifies the attack on the mask layer in the proximity of the boundary surface between the surface of the substrate and the mask layer.

The mask layer used in the inventive method may consist of $SiO_2$ on a surface of single-crystal Si, and the under-etching can be conducted in a hydrogen atmosphere at temperatures above 900° C. on the basis of the reaction of $Si + SiO_2 \rightarrow 2\,SiO$. This reaction is known, for example, from J. Manoliu et al., IEDM Digest, 1987, pages 20–23 for cleaning the substrate surface before the selective epitaxy. When conducting such conventional cleaning, however, an uncontrolled attack on the oxide sidewall can arise that leads to irregular edges in this region, which form a source for epitaxy defects. Attempts are therefore described in the literature to suppress this attack on the oxide sidewall.

In accordance with the inventive method, this reaction is conducted in a controlled fashion for under-etching the sidewall with regular edges.

Alternatively, the mask layer of the inventive method may be formed of at least two layers, whereby the lower layer is selectively etchable relative to the upper layer and relative to the substrate surface. In this case, the under-etching is achieved by selective etching of the lower layer. The lower layer thereby serves as an auxiliary layer. For example, a $Si_3N_4$ layer may be employed as the auxiliary layer on a substrate of silicon and a $SiO_2$ layer may be employed as the upper layer.

In order to avoid problems that arise at boundary surfaces between silicon nitride and silicon, in a further embodiment of the invention the auxiliary layer can be generated in composite fashion. Accordingly, a $SiO_2$ layer is applied directly onto the silicon surface of the substrate, a $Si_3N_4$ or polysilicon layer is applied on this $SiO_2$ layer, and a $SiO_2$ layer is applied on the layer of $Si_3N_4$ or polysilicon. The upper $SiO_2$ layer is far thicker than the composite auxiliary layer. In this embodiment, the under-etching is produced by selective etching if the oxide layer arranged at the surface and the upper oxide layer can be selectively etched relative to one another. This, for example, is the case if the lower oxide layer is produced from plasma oxide and the upper oxide layer is produced from doped CVD oxide, for example BPSG.

If the two oxide layers cannot be selectively etched relative to one another, then the under-etching is achieved, for example, on the basis of a geometry effect. An opening having the same cross-section is thereby produced first in the upper $SiO_2$ layer and in the auxiliary layer of $Si_3N_4$ or polysilicon. Subsequently, $SiO_2$ is selectively etched relative to $Si_3N_4$ or polysilicon and the silicon surface in an isotropic etching step. If the oxide layer arranged at the surface of the substrate has a thickness that is lower, for example, by a factor 10 than the upper oxide layer, then an under-etching is formed under the $Si_3N_4$ or polysilicon layer for geometrical reasons without causing the cross-section of the opening to change to a noteworthy extent in the region of the upper oxide layer.

A further possibility in accordance with the inventive method for producing the under-etching in the case of two $SiO_2$ layers that are not selectively etchable relative to one another is to first form an opening having the same cross-section in the upper $SiO_2$ layer and in the $Si_3N_4$ or polysilicon. $Si_3N_4$ or polysilicon is then selectively under-etched relative to $SiO_2$. Finally, the $Si_2O$ layer located at the surface of the substrate is etched in an isotropic etching step. Given an sufficiently large difference in the thicknesses of the two $SiO_2$ layers, the cross-section of the opening within the upper layer is also practically unchanged in this method.

The method of invention can be applied to a method for manufacturing a bipolar transistor. The single-crystal region is thereby employed as a collector.

Also, the method of the invention can be employed in a method for manufacturing a MOS transistor. The source and drain region are thereby produced in the single-crystal region.

DESCRIPTION OF THE PREFERRED EMBODIMENTS

Figure 1:
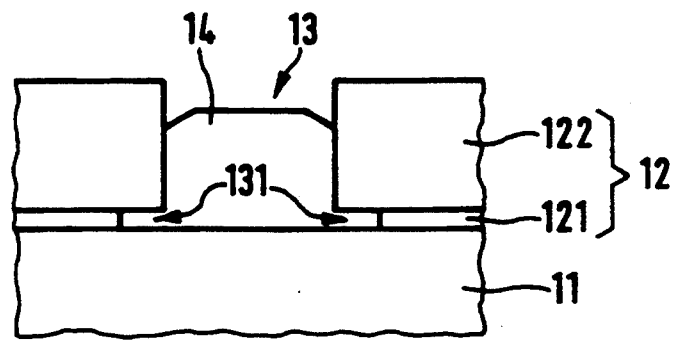
FIG. 1 shows a mask layer composed of two layers and having an opening within which a single-crystal region was produced in conformity with the method of the invention.

A mask layer 12, produced in a first embodiment of the inventive method, having an opening 13 is generated on a substrate 11 (see FIG. 1). The substrate 11 is composed, for example, of single-crystal silicon. The mask layer 12 is produced, for example, by applying a $Si_3N_4$ layer 121 onto the surface of the substrate 11 and by the subsequent application of a $SiO_2$ layer 122 onto the surface of the $Si_3N_4$ layer 121. The $Si_3N_4$ layer 121 is applied, for example, in a thickness of 10 through 50 nm; the $SiO_2$ layer 122 is applied in a thickness of, for example, 400 nm. For forming the opening 13, the $SiO_2$ layer 122 is first anisotropically structured. Subsequently, the $Si_3N_4$ layer 121 is isotropically etched selectively relative to $SiO_2$ and relative to Si. Phosphoric acid, for example, is employed for this purpose. An under-etching 131 is thereby produced beneath the $SiO_2$ layer 122. Due to the under-etching 131, the opening 13 has a sidewall with a step-shaped profile.

A single-crystal region 14 that extends in height into the region of the $SiO_2$ layer 123 is formed by selective epitaxy at the surface of the substrate 11 exposed within the opening 13. Since sidewall defects would be formed proceeding from the boundary surfaces between the $Si_3N_4$ layer 121 and the surface of the substrate 11 and grow up at an angle of approximately 55°, the growth of the sidewall defects is interrupted by the overhang above the under-etchings 131 formed by the SiO$_2$ layer 122. The single-crystal region 14 grows essentially free of sidewall defects in that part of the opening 13 limited by the SiO$_2$ layer 122.

Figure 2:
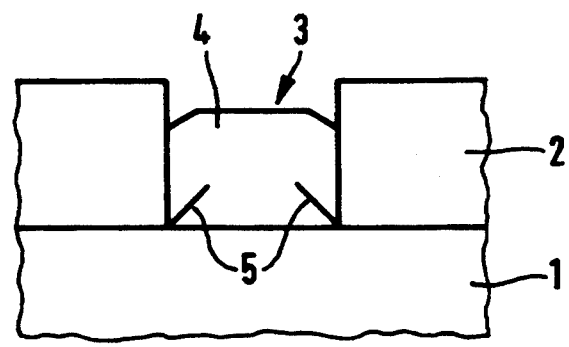
FIG. 2 shows a single-crystal region produced by selective epitaxy according to the prior art.

In the selective epitaxy of the prior art shown in FIG. 2, a mask layer 2, consisting of dielectric material, that has an opening 3 is applied on a substrate 1. The surface of the substrate 1 is exposed within the opening 3. Proceeding from the exposed surface of the substrate 1, a single-crystal region 4 is grown by selective epitaxy in the opening 3. Sidewall defects 5 thereby grow proceeding upwardly from the boundary surface between the dielectric material of the mask layer 2 and the substrate 11. These sidewall defects 5 limit the use possibilities for use of the single-crystal region 4.

Figure 3:
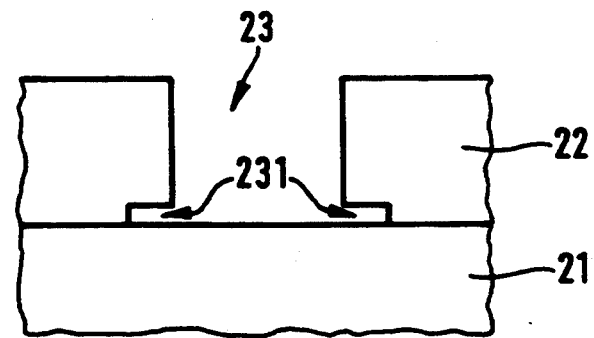
FIG. 3 shows a mask layer having an opening whose sidewall has a step-shaped profile in cross-section perpendicular to the substrate surface used in the inventive method.

In the embodiment of the invention shown in FIG. 3, a mask layer 22 having an opening 23 is applied onto the surface of a substrate 21 composed, for example, of single-crystal silicon. The mask layer 22 is composed, for example, of SiO$_2$. In the region of the surfaces of the mask layer 22, the opening 23 has a cross-section that is smaller than the cross-section in the region of the surface of the substrate 21. The cross-section of the opening 23 in the region of the surface of the substrate 21 is enlarged by under-etchings 231 that results in a step-shaped profile of the sidewall of the opening 23. The under-etchings 231 are formed in a hydrogen atmosphere at temperatures above 900° C. on the basis of the reaction Si+SiO$_2$→2 SiO . The under-etchings 231 are formed at such a depth that, when a single-crystal region (not shown) is grown by selective epitaxy in the opening 23, sidewall defects arising at the boundary surface of the mask layer 22 and the substrate surface 21 are interrupted in their growth by the overhang above the under-etchings 231.

Figure 4:
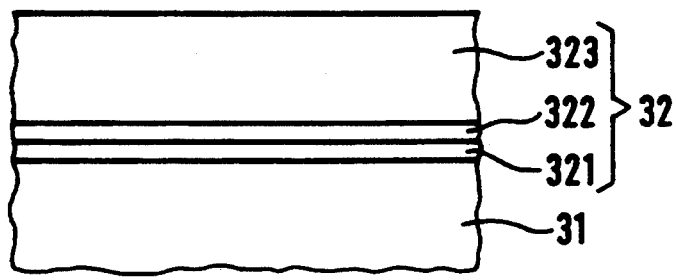
FIGS. 4 through 7 show the production of an opening in a mask layer that is composed of three layers in accordance with the inventive method.

In the embodiment of FIG. 4, a first auxiliary layer 231 of, for example, SiO$_2$ is applied on a substrate 31 that, for example, is composed of single-crystal silicon. A second auxiliary layer 322 of, for example, Si$_3$N$_4$ is applied on the first auxiliary layer 321. A main layer 323 of, for example, SiO$_2$ is applied onto the second auxiliary layer 322. The first auxiliary layer 321 is deposited, for example, in a thickness of 30 nm; the second auxiliary layer 322 is deposited, for example, in a thickness of 30 nm; and the main layer 323 is deposited, for example, in a thickness of 400 nm. The first auxiliary layer 321, the second auxiliary layer 322 and the main layer 323 together form a mask layer 32.

Figure 5:
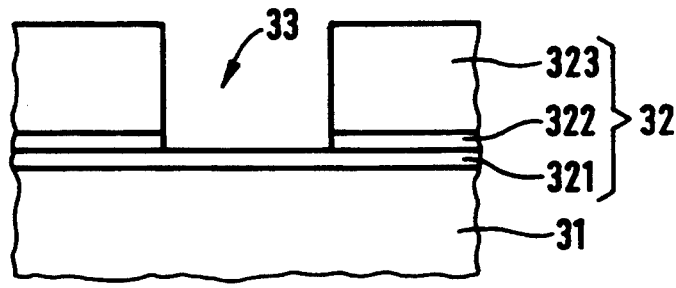

In order to form an opening 33 in the mask layer 32 (see FIG. 5), the main layer 323 and the second auxiliary layer 322 are first structured in an anisotropic etching process. An etching process such as plasma etching in CF$_4$ is employed for this purpose.

Figure 6:
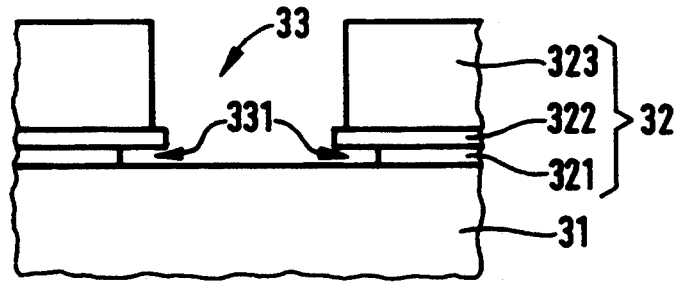

Subsequently, an isotropic etching of the first auxiliary layer 321 is carried out, whereby an under-etching 331 under the second auxiliary layer 322 is formed (see FIG. 6).

For example, etching in HF is suitable as the isotropic etching process. The first auxiliary layer 321 as well as the main layer 323 are composed of SiO$_2$. For achieving the under-etching 331, the etching rate in the lateral direction in the first auxiliary layer 321 must be higher than in main layer 323. When the first auxiliary layer 321 is far thinner than the main layer 323, this is guaranteed for geometrical reasons. The etching erosion at the sidewalls of the opening 33 in the region of the main layer 323 is lower than the depth of the under-etchings 331.

Figure 7:
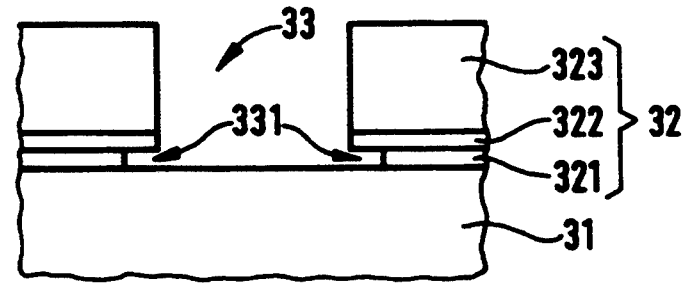

The second auxiliary layer 322 is matched to the edges of the opening 33 of the main layer 323 by an etching of the Si$_3$N$_4$ of the second auxiliary layer 322 that is selective relative to SiO$_2$ (see FIG. 7). When the first auxiliary layer 321 and the main layer 323 are formed in different manufacturing methods, so that they are selectively etchable relative to one another, the under-etching 331 is formed in an etching method that is selective relative to the second auxiliary layer and relative to the main layer 323. By producing the first auxiliary layer 321 of plasma oxide and the main layer 323 of BPSG, a selective etching of the first auxiliary layer 321 with buffered NH$_4$F is possible.

When the main layer 323 is far thicker than the first auxiliary layer 321, i.e. at least by a factor of 10, the main layer 323 is practically not attacked at all in the formation of the under-etchings 331. In this case, the second, selective etching of the silicon nitride can be omitted.

Figure 8:
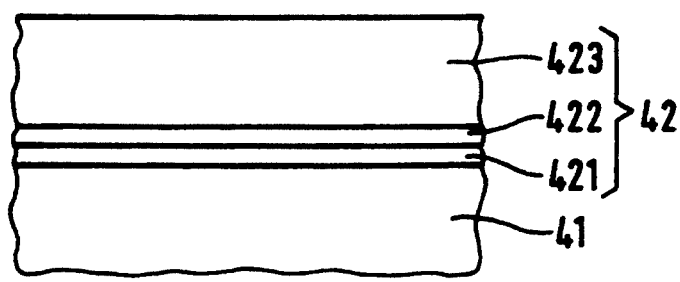
FIGS. 8 through 11 show another embodiment for producing an opening in a mask layer that is composed of three layers in accordance with the inventive method.
Figure 9:
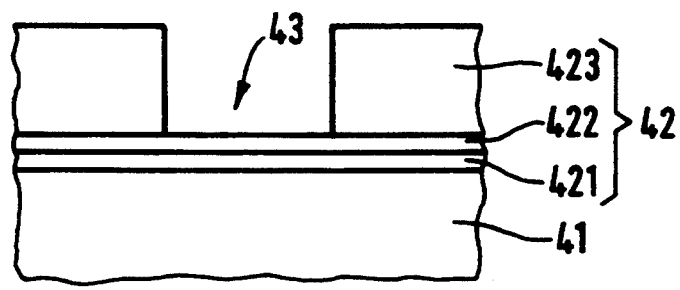

In the embodiment of FIG. 8, a first auxiliary layer 421 is applied on a substrate 41 of, for example, single-crystal silicon. A second auxiliary layer 422 is applied onto the first auxiliary layer 421. A main layer 423 is applied onto the second auxiliary layer 422. The first auxiliary layer 421 is formed, for example, of SiO$_2$ in a thickness of, for example, 30 nm. The second auxiliary layer of, for example, polysilicon is applied in a thickness of, for example, 30 nm. The main layer 423 of, for example, SiO$_2$ is applied in a thickness of, for example, 400 nm. The first auxiliary layer 421, the second auxiliary layer 422 and the main layer 423 form a mask layer 42 together.

Figure 10:
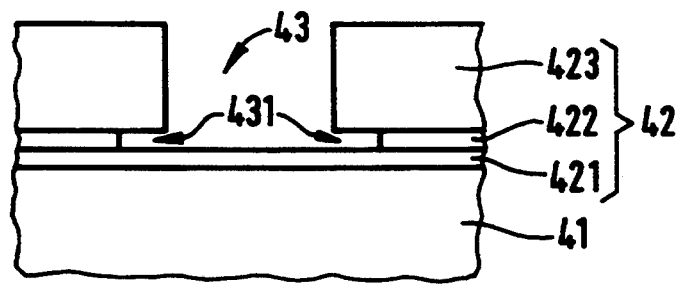

For forming an opening 43 in the mask layer 42, the main layer is first anisotropically etched. This etching ensues selectively relative to the second auxiliary layer 422. For example, anisotropic plasma etching is suitable for this purpose. Subsequently, the second auxiliary layer 422 is isotropically and selectively etched (see FIG. 10). Under-etchings 431 under the main layer 423 thereby arise. In the case of polysilicon, for example, etching with choline is suitable as the etching process. The under-etching 431 extends, for example, 60 nm back behind the edge of the main layer 423.

Silicon nitride can alternatively be employed as the second auxiliary layer; the isotropic etching then ensues with phosphoric acid.

Figure 11:
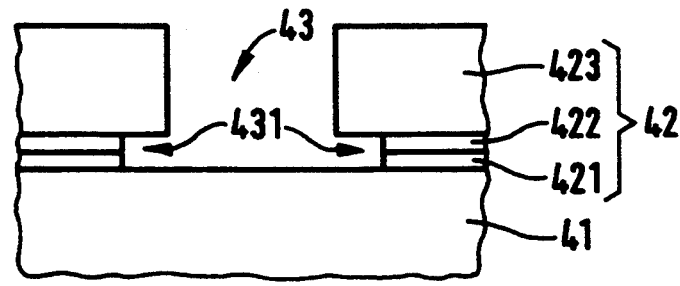

Subsequently, the first auxiliary layer 421 is isotropically etched selectively relative to the second auxiliary layer 422 and relative to the surface of the substrate 41 (see FIG. 11). For example, 5% HF is suitable as the etchant. Since the first auxiliary layer 421 is far thinner than the main layer 423, the main layer 423, which is composed of the same material (SiO$_2$) as the first auxiliary layer 421, SiO$_2$, is practically not attacked in this isotropic etching. In the isotropic etching, the exposed part of the first auxiliary layer 421 is removed. As a result, the under-etching 431 enlarges by the thickness of the first auxiliary layer 421. The single-crystal region is subsequently grown by selective epitaxy (not shown) in the opening 43.

In the exemplary embodiments set forth with reference to FIGS. 1 and 3–11, the mask layer having the opening and the single-crystal region can alternatively be grown on a substrate that consists of single-crystal silicon only in the region of the opening. In particular, a SOI substrate with a thin, single-crystal silicon layer at the surface of an insulating layer can be employed as the substrate.

Figure 12:
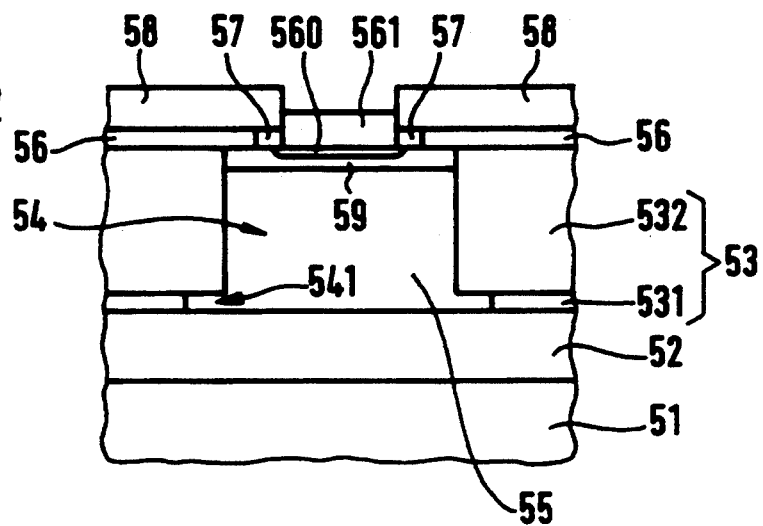
FIG. 12 shows a bipolar transistor having a collector produced according to the method of the invention.

FIG. 12 shows how the method of the invention can be utilized for manufacturing a bipolar transistor. An n+-doped layer 52 is produced surface-wide, for example by implantation or epitaxially, on a substrate 51 of, for example, single-crystal silicon. A mask layer 53 that has a Si$_3$N$_4$ layer 531 that is, for example, 10 through 50 nm thick and a SiO$_2$ layer 532 that, for example, is 500 nm thick is applied on the surface of the n+-doped layer 52. The mask layer 53 can alternatively be composed according to the exemplary embodiments set forth with reference to FIGS. 4 through 11. An opening 54 is formed in the mask layer 53 according to one of the methods set forth in the above-described exemplary embodiments. The opening 54 has under-etchings 541 that extend under the SiO$_2$ layer 532.

A collector 55 is deposited in the opening 54 by selective epitaxy. For example, the selective epitaxy ensues at temperatures between 500° C. and 1000° C. in a Si—HCl—H atmosphere. Preferably, the selective epitaxy is implemented at 855° C., 60 slm H$_2$, 220 sccm dichloro-silane, 10 torr.

The single-crystal region that is provided with an appropriate doping for the formation of the collector 55 is grown such that, after the removal of the facets arising at the surface in the selective epitaxy, the SiO$_2$ layer 532 and the single-crystal region form a planar surface. A base terminal 56 of p-doped polysilicon is formed at the surface of the produced structure. The base terminal 56 is essentially arranged at the surface of the SiO$_2$ layer 532; it projects beyond this and extends into the region of the single-crystal region that fills the opening 54. Si$_3$N$_4$ spacers 57 are formed at lateral sidewalls of the base terminal 56. The surface of the Si$_3$N$_4$ spacers 57 and of the base terminal 56 is covered with a SiO$_2$ structure 58.

In an etching step that attacks silicon selectively relative to Si$_3$N$_4$ and SiO$_2$, the uppermost layer of the single-crystal region that is arranged above the collector 55 is removed. Under-etchings under the Si$_3$N$_4$ spacers 57 and under the base terminal 56 thereby arise.

A p-doped base 59 is grown by selective epitaxy on the exposed surface of the collector 55. An n-doped emitter 560 is formed at the surface of the base 59 by out-diffusion from an emitter terminal 561 that is composed of correspondingly doped polysilicon.

Figure 13:
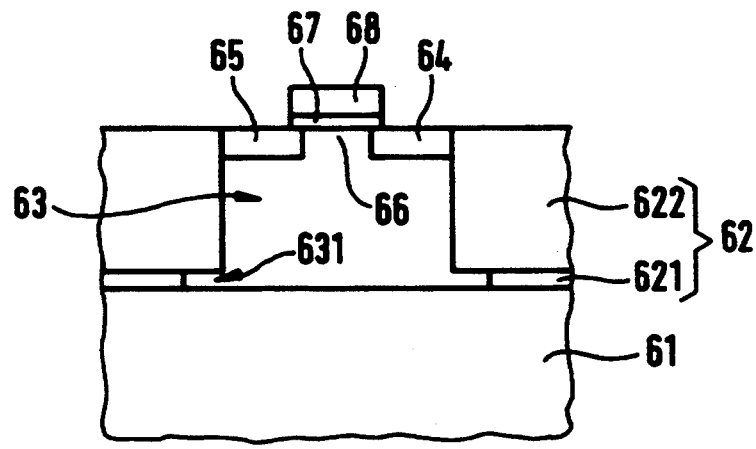
FIG. 13 shows a MOS transistor having a single-crystal region produced according to the method of the invention.

The manufacture of a MOS transistor employing the method of the invention shall be set forth below with reference to FIG. 13. A mask layer 62 is applied on a substrate 61 of, for example, single-crystal silicon. The mask layer 62 has a Si$_3$N$_4$ layer 621 at the surface of the substrate 61 and a SiO$_2$ layer 622 at the surface of the Si$_3$N$_4$ layer 621. The mask layer 62 can alternatively be constructed of more than two layers in accord with the exemplary embodiments set forth with reference to FIGS. 4 through 11.

An opening 63 having a step-shaped sidewall profile is formed in the mask layer 62. The step-shaped sidewall of the opening 63 is achieved by under-etchings 631 beneath the SiO$_2$ layer 622.

The opening 63 is filled with single-crystal silicon by selective epitaxy. For example, the selective epitaxy is implemented at temperatures between 500° C. and 1000° C. in a Si—HCl—H atmosphere. By, for example, implantation, a source region 64, a drain region 65 and a channel region 66 are formed in the single-crystal region filling the opening 63. Source and drain regions 64 and 65 are thereby doped with a conductivity type opposite that of the single-crystal region. A gate dielectric 67 is formed at the surface of the channel region 66 and a gate electrode 68 is formed at the surface of the gate dielectric 67.

Figure 14:
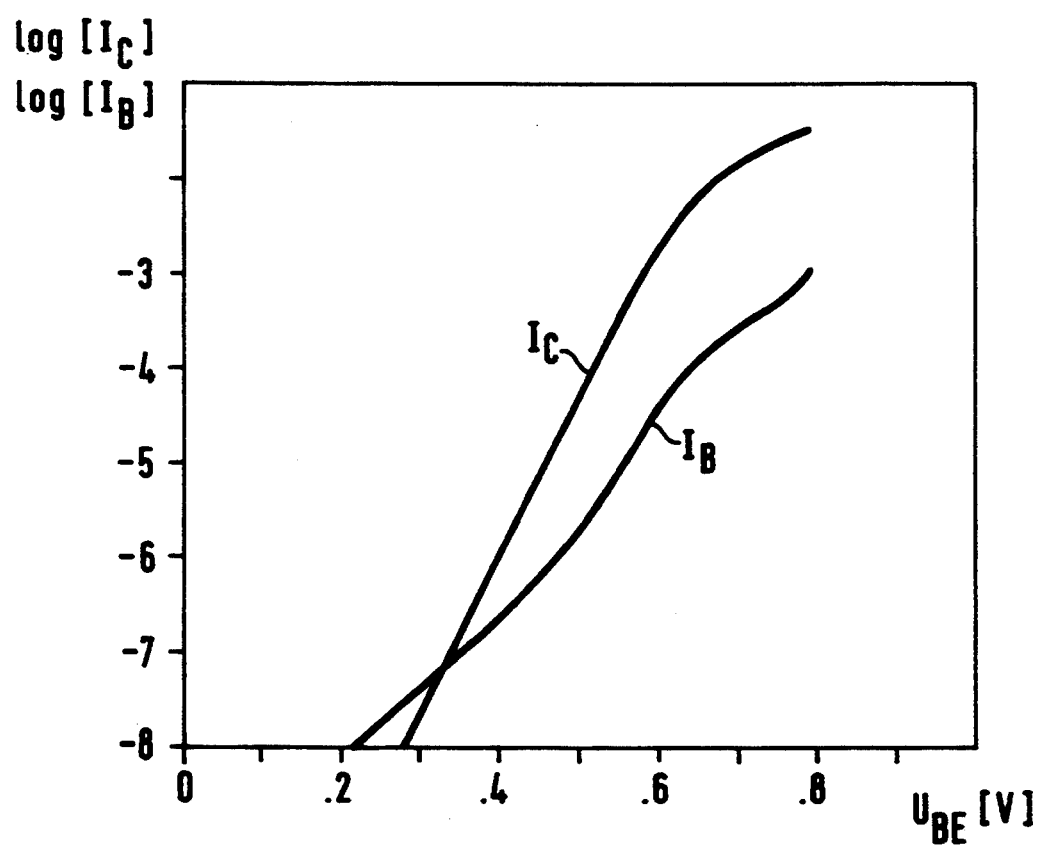
FIG. 14 shows a Gummel plot of a 560K multi-emitter and multi-collector array having selectively deposited collector produced according to the method of the invention.

FIG. 14 shows a Gummel plot of a 560K multi-emitter and multi-collector array. The array is formed by 5.6×10$^5$ bipolar transistors, each of which has a collector selectively deposited according to the method of the invention. The active area of each bipolar transistor amounts to 0.4×3 μm$^2$. The individual bipolar transistors are insulated from one another by the mask layer. The aggregate sidewall length in the array amounts to 6.8×56 cm. It may be seen from the Gummel plot that this sidewall length is practically free of sidewall defects.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for producing a laterally limited, single-crystal region on a substrate with selective epitaxy, said substrate comprised of single-crystal semiconductor material at least in the region of a surface of said substrate, said method comprising the steps of:
   generating a mask layer consisting essentially of dielectric material on said surface of said substrate by generating a first layer on said surface of said substrate and generating a second layer over said first layer, said first and second layers in combination forming said mask layer;
   producing an opening in said mask layer through which said surface of said substrate is exposed, said opening having a first extent parallel to and adjacent said surface of said substrate laterally projecting beyond a second extent of said opening at an upper surface of said mask layer, and said first and second extents being connected by a sidewall of said opening having a step-shaped profile in a cross-section of said opening proceeding perpendicularly relative to said surface of said substrate, said opening being produced by etching said second layer of said mask layer in an anisotropic etching process to define said second extent of said opening at said surface of said mask layer, and by selectively etching said first layer relative to said second layer in an isotropic etching process to enlarge said opening parallel to the surface of said substrate by under-etching said first layer beyond the opening produced in said second layer by said anisotropic etching process, to define said first extent of said opening in said mask layer; and
   forming a single-crystal region on said surface of said substrate by selective epitaxy within said opening.

2. A method as claimed in claim 1 wherein said substrate, at least in said region of said surface, consists of single-crystal silicon, and wherein said mask layer consists of SiO$_2$, and wherein the step of conducting said isotropic etching process is further defined by conducting said isotropic etching process at a temperature above 900° C. in a hydrogen atmosphere on the basis of the reaction Si+SiO$_2$→2SiO .

3. A method as claimed in claim 1 wherein said substrate, at least in the region of said surface, comprises single-crystal silicon and wherein the step of generating said mask layer is further defined by forming said first layer of $Si_3N_4$ and forming said second layer of $SiO_2$.

4. A method for producing a laterally limited, single-crystal region on a substrate with selective epitaxy, said substrate comprised of single-crystal semiconductor material at least in the region of a surface of said substrate, said method comprising the steps of:

generating a mask layer consisting essentially of dielectric material on said surface of said substrate by generating a first auxiliary layer on said surface of said substrate, generating a second auxiliary layer over said first auxiliary layer, and generating a main layer over said second auxiliary layer, said first auxiliary layer, said second auxiliary layer and said main layer, in combination, forming said mask layer;

producing an opening in said mask layer through which said surface of said substrate is exposed, said opening having a first extent parallel to and adjacent said surface of said substrate laterally protecting beyond a second extent of said opening at an upper surface of said mask layer, and said first and second extents being connected by a sidewall of said opening having a step-shaped profile in a cross-section of said opening proceeding perpendicularly relative to said surface of said substrate, said opening in said mask layer being produced by etching said main layer in an anisotropic etching process to expose said second auxiliary layer, selectively etching said second auxiliary layer relative to said main layer in an isotropic etching process to expose said first auxiliary layer and to produce an opening in said second auxiliary layer defining said second extent of said opening in said mask layer, and selectively etching said first auxiliary layer relative to said second auxiliary layer in said isotropic etching process to expose said surface of said substrate by under-etching said first auxiliary layer beyond the opening produced in said second auxiliary layer, to define said first extent of said opening in said mask layer; and forming a single-crystal region on said surface of said substrate by selective epitaxy within said opening.

5. A method as claimed in claim 4 wherein the step of generating said mask layer is further defined by forming said first auxiliary layer of $SiO_2$, forming said second auxiliary layer of material selected from the group consisting of $Si_3N_4$ and polysilicon, and forming said main layer $SiO_2$.

6. A method as claimed in claim 5 wherein the step of selectively etching said first auxiliary layer is further defined by selectively etching said first auxiliary layer relative to said main layer as well as relative to said second auxiliary layer.

7. A method as claimed in claim 5 comprising the additional step of:

generating said first auxiliary layer with a thickness substantially less than a thickness of said main layer so that in said under-etching of said first auxiliary layer said isotropic etching, due to geometry, primarily attacks said first auxiliary layer.

8. A method as for producing a laterally limited, single-crystal region on a substrate with selective epitaxy, said substrate comprised of single-crystal semiconductor material at least in the region of a surface of said substrate, said method comprising the steps of:

generating a mask layer consisting essentially of dielectric material on said surface of said substrate by generating a first auxiliary layer on said surface of said substrate, generating a second auxiliary layer over said first auxiliary layer, and generating a main layer over said second auxiliary layer, said first auxiliary layer, said second auxiliary layer and said main layer, in combination, forming said mask layer producing an opening in said mask layer through which said surface of said substrate is exposed, said opening having a first extent parallel to and adjacent said surface of said substrate laterally projecting beyond a second extent of said opening at an upper surface of said mask layer, and said first and second extents being connected by a sidewall of said opening having a step-shaped profile in a cross-section of said opening proceeding. perpendicularly relative to said surface of said substrate, said opening in said mask layer being produced by etching said main layer in an anisotropic etching process to produce an opening in said main layer defining said first extent of said opening in said mask layer, selectively etching said second auxiliary layer relative to said main layer and relative to said first auxiliary layer in an isotropic etching process by under-etching said second auxiliary layer beyond the opening produced in said main layer to expose said first auxiliary layer and to define said second extent of said opening in said mask layer, and selectively etching the exposed portion of said first auxiliary layer relative to said second auxiliary layer in said isotropic etching process.

9. A method as claimed in claim 8 wherein the step of generating said mask layer is further defined by forming said first auxiliary layer and said main layer of $SiO_2$ and forming said first auxiliary layer significantly thinner than said main layer, and forming said second auxiliary layer of material selected from the group consisting of $Si_3N_4$ and polysilicon.

10. A method as claimed in claim 1 wherein the step of forming said single-crystal region by selective epitaxy is further defined by conducting said selective epitaxy in a temperature range between 500° C. and 1000° C. in a Si—HCl—H atmosphere.

11. A method for manufacturing a bipolar transistor on a substrate comprised of a single-crystal semiconductor material, at least in the region of a surface of said substrate, said method comprising the steps of:

producing a laterally limited, single-crystal region on said substrate by generating a mask layer consisting essentially of dielectric material on said surface of said substrate, producing an opening in said mask layer through which said surface of said substrate is exposed, said opening having a first extent parallel to and adjacent said surface of said substrate laterally projecting beyond a second extent of said opening at an upper surface of said mask layer, and said first and second extents being connected by a sidewall of said opening having a step-shaped profile in a cross-section of said opening proceeding perpendicularly relative to said surface of said substrate, and forming a single-crystal region on said surface of said substrate, having a height terminating at an upper surface of said mask layer, by selective epitaxy within said opening, said single-crystal region having an upper surface;

forming a collector terminal in said substrate beneath said single-crystal region;

forming a transistor collector by doping said single-crystal region;

forming a transistor base at said upper surface of said single-crystal region;

forming a base terminal of doped polycrystalline silicon at said upper surface of said mask layer extending to and adjacent said upper surface of said single-crystal region and annularly surrounding said single-crystal region;

generating an insulating layer with an insulating sidewall over said base terminal having an opening leaving a portion of said transistor base exposed; and forming a transistor emitter on said transistor base by filling said opening in said insulating layer with doped polysilicon and driving out carriers from said doped polysilicon into an upper portion of said transistor base.

12. A method for manufacturing a bipolar transistor as claimed in claim 11 comprising the additional step, after forming said base terminal and said insulating layer with said opening, of:

etching away a portion of said single-crystal region exposed in said opening in said insulating layer including under-etching beneath a portion of said base terminal to expose an upper surface of said collector formed in said single-crystal region;

and wherein the step of forming said transistor base is further defined by forming said transistor base by selective epitaxy on said exposed upper surface of said collector.

13. A method as claimed in claim 11 wherein the step of producing said laterally limited, single-crystal region on said substrate is further defined by the steps of:

generating said mask layer by generating a first auxiliary layer on said surface of said substrate and generating a second layer over said first layer, said first and second layers in combination forming said mask layer;

etching said second layer in an anisotropic etching process to produce an opening in said second layer which defines said second extent of said opening in said mask layer; and selectively etching said first layer relative to said second layer in an isotropic etching process to expose said surface of said substrate by under-etching said first layer beyond the opening produced in said second layer, to define said first extent of said opening in said mask layer.

14. A method as claimed in claim 11 wherein the step of producing said laterally limited, single-crystal region on said substrate is further defined by the steps of:

generating said mask layer by generating a first auxiliary layer on said surface of said substrate, generating a second auxiliary layer over said first auxiliary layer, and generating a main layer over said second auxiliary layer, said first auxiliary layer, said second auxiliary layer and said main layer, in combination, forming said mask layer;

etching said main layer in an anisotropic etching process to produce an opening in said main layer defining said second extent of said opening in said mask layer and exposing said second auxiliary layer;

selectively etching said second auxiliary layer relative to said main layer in an isotropic etching process to produce an opening in said second auxiliary layer and exposing said first auxiliary layer; and selectively etching said first auxiliary layer relative to said second auxiliary layer in said isotropic etching process to expose said surface of said substrate by under-etching said first auxiliary layer beyond the opening produced in said second auxiliary layer, to define said first extent of said opening in said main layer.

15. A method as claimed in claim 11 wherein the step of producing said laterally limited, single-crystal region on said substrate is further defined by the steps of:

generating said mask layer by generating a first auxiliary layer on said surface of said substrate, generating a second auxiliary layer over said first auxiliary layer, and generating a main layer over said second auxiliary layer, said first auxiliary layer, said second auxiliary layer and said main layer, in combination, forming said mask layer;

etching said main layer in an anisotropic etching process to produce an opening in said main layer defining said second extent of said opening in said mask layer;

selectively etching said second auxiliary layer relative to said main layer and relative to said first auxiliary layer in an isotropic etching process by under-etching said second auxiliary layer beyond the opening produced in said main layer to define said second extent of said opening in said mask layer and to expose said first auxiliary layer; and selectively etching the exposed portion of said first auxiliary layer relative to said second auxiliary layer in said isotropic etching process.

16. A method for manufacturing a MOS transistor on a substrate comprised of single-crystal semiconductor material at least in a region of a surface of said substrate, said method comprising the steps of:

producing a laterally limited, single-crystal region on said substrate by generating a mask layer consisting essentially of dielectric material on said surface of said substrate, said mask layer being generated by generating a first layer on said surface of said substrate and generating a second layer over said first layer, said first and second layers in combination forming said mask layer, producing an opening in said mask layer through which said surface of said substrate is exposed, said opening having a first extent parallel to and adjacent said surface of said substrate laterally projecting beyond a second extent of said opening at an upper surface of said mask layer, and said first and second extents being connected by a sidewall of said opening having a step-shaped profile in a cross-section of said opening proceeding perpendicularly relative to said surface of said substrate, said opening in said mask layer being produced by etching said second layer in an anisotropic etching process to produce an opening in said second layer to define said second extent of said opening in said mask layer and by selectively etching said first layer relative to said second layer in an isotropic etching process to expose said surface of said substrate by under-etching said first layer beyond the opening produced in said second layer, to define said first extent of said opening in said mask layer, and forming a single-crystal region on said surface of said substrate by selective epitaxy within said opening, said single-crystal region terminating in height at said upper surface of said mask layer;

forming a transistor source, a transistor drain and a transistor channel region in said single-crystal region, said channel region having a surface coextensive with a portion of an upper surface of said single-crystal region;

forming a gate dielectric layer over said channel region on said single-crystal region; and forming a gate electrode on an upper surface of said gate dielectric layer.

* * * * *